US012795956B2

(12) United States Patent
Lin et al.

(10) Patent No.: US 12,795,956 B2
(45) Date of Patent: Nov. 10, 2026

(54) CAPACITOR ARRAY FORMATION USING SINGLE ETCH PROCESS

(71) Applicant: Taiwan Semiconductor Manufacturing Company, Ltd., Hsinchu (TW)

(72) Inventors: Meng-Hsien Lin, Tainan City (TW); Hsing-Chih Lin, Tainan City (TW); Wei-Chih Weng, Tainan City (TW); Kuan-Hua Lin, New Taipei City (TW); Jen-Cheng Liu, Hsin-Chu City (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 459 days.

(21) Appl. No.: 18/362,101

(22) Filed: Jul. 31, 2023

(65) Prior Publication Data

US 2025/0048658 A1 Feb. 6, 2025

(51) Int. Cl.
*H10D 1/00* (2025.01)
*H10D 1/68* (2025.01)
(Continued)

(52) U.S. Cl.
CPC ............. *H10D 1/042* (2025.01); *H10D 1/716* (2025.01); *H10D 84/212* (2025.01);
(Continued)

(58) Field of Classification Search
None
See application file for complete search history.

(56) References Cited

U.S. PATENT DOCUMENTS 6,127,070 A * 10/2000 Yang ........................ H10P 50/73 438/692
2004/0232557 A1* 11/2004 Kim .................. H01L 21/76843 257/E21.582

(Continued)

FOREIGN PATENT DOCUMENTS

CN 102569250 A * 7/2012
TW 202318646 A 5/2023

OTHER PUBLICATIONS

Machine Translation: CN-102569250-A (Year: 2012).*

*Primary Examiner* — Nilufa Rahim
(74) *Attorney, Agent, or Firm* — Eschweiler & Potashnik, LLC

(57) ABSTRACT

In some embodiments, the present disclosure relates to an integrated device, including a substrate; an interconnect structure disposed over the substrate, the interconnect structure including an dielectric; a first bottom electrode structure disposed in the dielectric, the first bottom electrode structure having a first width as measured between outer sidewalls of the first bottom electrode structure and a first depth as measured from an upper surface of the dielectric; and a second bottom electrode structure disposed in the dielectric and spaced apart from the first bottom electrode structure, the second bottom electrode structure having a second width as measured between outer sidewalls of the second bottom electrode structure and a second depth as measured from the upper surface of the dielectric; where the first width is greater than the second width and the first depth is greater than the second depth.

20 Claims, 17 Drawing Sheets

(51) Int. Cl.

| | |
|---|---|
| ***H10D 84/00*** | (2025.01) |
| ***H10W 20/00*** | (2026.01) |
| ***H10W 20/40*** | (2026.01) |
| ***H10W 20/42*** | (2026.01) |

(52) U.S. Cl.

CPC ......... *H10W 20/089* (2026.01); *H10W 20/42* (2026.01); *H10W 20/496* (2026.01)

(56) References Cited

U.S. PATENT DOCUMENTS

| | | | | |
|---|---|---|---|---|
| 2010/0123199 | A1* | 5/2010 | Kawahara | H10D 89/10<br>257/379 |
| 2010/0224925 | A1* | 9/2010 | Ching | H10D 1/042<br>257/532 |
| 2011/0027962 | A1* | 2/2011 | Bernstein | H10P 50/242<br>438/386 |
| 2018/0166321 | A1* | 6/2018 | Sun | H10P 50/283 |
| 2019/0019787 | A1* | 1/2019 | Park | H01G 4/33 |
| 2023/0065446 | A1 | 3/2023 | Cheng | |
| 2023/0187515 | A1 | 6/2023 | Yemenicioglu et al. | |
| 2023/0238277 | A1 | 7/2023 | Shih et al. | |

* cited by examiner

400c

CAPACITOR ARRAY FORMATION USING SINGLE ETCH PROCESS

BACKGROUND

Many modern day electronic devices include capacitors. The capacitance of a capacitor depends on multiple factors, including the surface area of a first and second electrode, the proximity of the first and second electrode, and the permittivity of a dielectric between the first and second electrode. The surface area of the first and second electrodes may be formed in horizontal formations across the electronic device, in vertical formations, or in both formations depending on the target capacitance and availability of space in the electronic device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
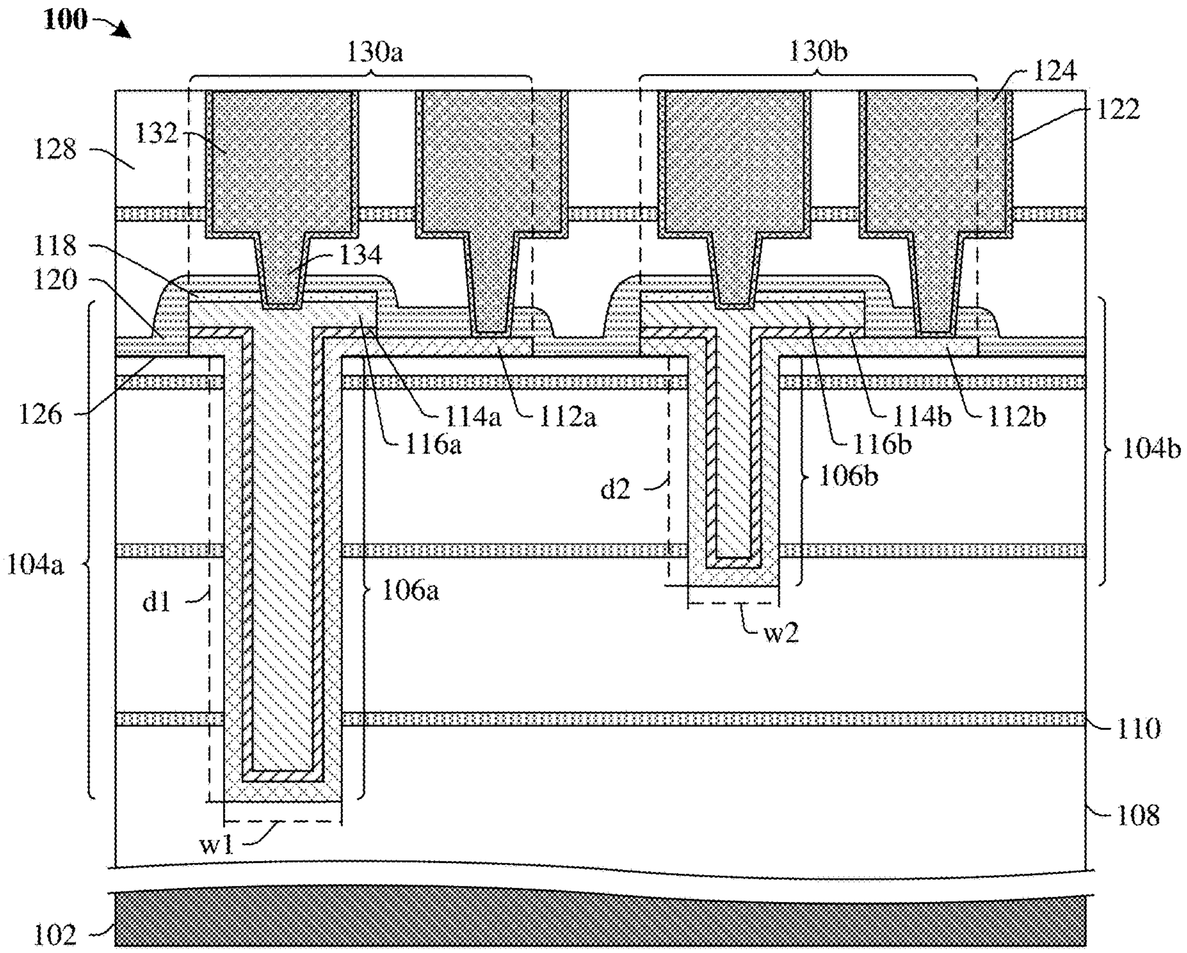
FIG. 1 illustrates a cross-sectional view of some embodiments of an integrated chip having a plurality of capacitors with bottom electrode structures of different depths and widths.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Capacitors are used for a variety of purposes in integrated devices, including memory, image processing, and sensing apparatus. The capacitance of a capacitor is dependent on multiple factors, including the surface area of a first and second electrode, the proximity of the first and second electrode, and the permittivity of a dielectric between the first and second electrode. When formed using back-end-of-line (BEOL) processes, capacitors may be formed having a surface area spread across a dielectric, with the surface area confined in trenches etched into the dielectric, or a combination of both of these distributions. Capacitors spread horizontally across the dielectric may be patterned using a single etching process and may have a large variety of capacitances without increasing the number of etches used, though they use a larger surface area of the integrated chip than a vertical capacitor. Vertical capacitors (e.g., capacitors formed in trenches) extend through the integrated device vertically, and therefore use a smaller surface area of the integrated chip than a horizontally spread capacitor, which may result in a greater density of capacitors fitting into a single layer of the integrated device. However, the method of forming vertical capacitors typically uses separate masks and etching steps to form trenches of different depths to form the vertical capacitors in, resulting in increased costs and low flexibility. Capacitors utilizing a combination of both horizontal and vertical structures increase the flexibility of the capacitor array, but lower the density of capacitor that may fit in a single layer of the integrated device. A capacitor array with the high density of capacitors available to arrays utilizing vertical capacitors, a low number of masking and etching steps, and the flexibility of capacitances available to arrays utilizing horizontally spread capacitors is desirable.

The present disclosure provides an integrated device comprising capacitors with bottom electrode structures of different widths and different depths. The capacitors are formed by etching a plurality of trenches with multiple depths into a dielectric layer. The plurality of trenches are etched using a single etching process and a masking layer with openings of varying widths. The widths of the openings in the masking layer result in the etch rate of the plurality of trenches to vary, due to the etch-loading effect. The differences in etch rate leads to the plurality of trenches having different depths. Capacitors are then formed in the plurality of trenches. Capacitors formed in the trenches with greater depths and widths have a greater surface area. The difference in surface area of the capacitors results in the capacitors having different capacitances without having large variations in the horizontal surface area used for each capacitor or multiple etch steps for the different depths. Therefore, the presented method is more cost effective and flexible than related methods of capacitor production.

FIG. 1 illustrates a cross-sectional view 100 of some embodiments of an integrated chip having a plurality of capacitors with bottom electrode structures of different depths and widths.

An interconnect structure comprising an interlayer dielectric 108 is formed over a substrate 102. A first bottom electrode 112*a*, and a second bottom electrode 112*b* are formed over an upper surface 126 of the interlayer dielectric 108. In some embodiments, the first bottom electrode 112*a* and the second bottom electrode 112*b* are separated by a passivation layer 120 and are part of a first capacitor 104*a* and a second capacitor 104*b*, respectively.

A first dielectric 114*a* and a first top electrode 116*a* overly the first bottom electrode 112*a*. The first dielectric 114*a* separates the first bottom electrode 112*a* from the first top electrode 116*a*. A second dielectric 114*b* and a second top electrode 116*b* overly the second bottom electrode 112*b*. The second dielectric 114*b* separates the second bottom electrode 112*b* from the second top electrode 116*b*.

The first bottom electrode 112*a* has a first width w1 measured between outer sidewalls of the first bottom electrode 112*a*. The first bottom electrode 112*a* further has a first depth d1 measured from an upper surface 126 of the interlayer dielectric 108. The second bottom electrode 112*a* has a second width w2 measured between outer sidewalls of the second bottom electrode 112*b*. The second bottom electrode 112*b* further has a second depth d2 measured from an upper surface 126 of the interlayer dielectric 108. The first width w1 is greater than the second width w2, and the first depth d1 is greater than the second depth d2. The difference between the first depth d1 and the second depth d2 may be attributed to the difference in a magnitude of the etch-loading effect that occurs during an etching process before the formation of the first and second bottom electrodes 112*a*, 112*b*. The difference in the magnitude of the etch-loading effect is a result of the difference between the first width w1 and the second width w2, where a greater width results in a greater etch depth.

In some embodiments, the first width w1 is measured between outer sidewalls of a first bottom electrode structure 106*a* of the first bottom electrode 112*a*. Similarly, the second width w2 is measured between outer sidewalls of a second bottom electrode structure 106*b* of the second bottom electrode 112*b*. In further embodiments, the first depth d1 is measured from the upper surface 126 of the interlayer dielectric 108 to a bottom surface of the first bottom electrode structure 106*a*, and the second depth d2 is measured from the upper surface 126 of the interlayer dielectric 108 to a bottom surface of the second bottom electrode structure 106*b*. The first bottom electrode structure 106*a* extends from a first horizontal portion 130*a* of the first bottom electrode 112*a* overlying the upper surface 126 of the interlayer dielectric 108. The second bottom electrode structure 106*b* extends from a second horizontal portion 130*b* of the second bottom electrode 112*b* overlying the upper surface 126 of the interlayer dielectric 108. In some embodiments, the first horizontal portion 130*a* has a first area and the second horizontal portion 130*b* has a second area different from the first area. In some embodiments, the first bottom electrode structure 106*a* extends through one or more etch stop layers 110. In further embodiments, the second bottom electrode structure 106*b* does not extend through the one or more etch stop layers 110. In some embodiments, the first bottom electrode structure 106*a* and the second bottom electrode structure 106*b* are part of a single capacitor and are electrically coupled by a metal line (not shown) running continuously between the first bottom electrode structure 106*a* and the second bottom electrode structure 106*b*.

An anti-reflect coating (ARC) 118 overlies the first top electrode 116*a* and the second top electrode 116*b*. A passivation layer 120 conformally overlies the ARC 118, the first top electrode 116*a*, the second top electrode 116*b*, and the upper surface 126 of the interlayer dielectric 108. Additional dielectric layers 128 of the interlayer dielectric 108 are arranged above the passivation layer 120. A first wire level 124 is arranged in the additional dielectric layers 128. The first wire level 124 comprises wires 132 and vias 134 that are electrically coupled to the first capacitor 104*a* and the second capacitor 104*b*. In some embodiments, the first wire level 124 is separated from the additional dielectric layers 128 of the interlayer dielectric 108 by first barrier layers 122. In some embodiments, the first barrier layer 122 may comprise a metal-nitride such as titanium (Ti), tantalum (Ta), titanium nitride (TiN), tantalum nitride (TaN), the like, or a combination of the foregoing. In some embodiments, upper surfaces of the first bottom electrode 112*a* and the second bottom electrode 112*b* are electrically coupled to wires in the first wire level 124. In some embodiments, the upper surfaces are contacting the vias or the first barrier layers 122 surrounding the vias that are contacting the first wire level 124.

Figure 2:
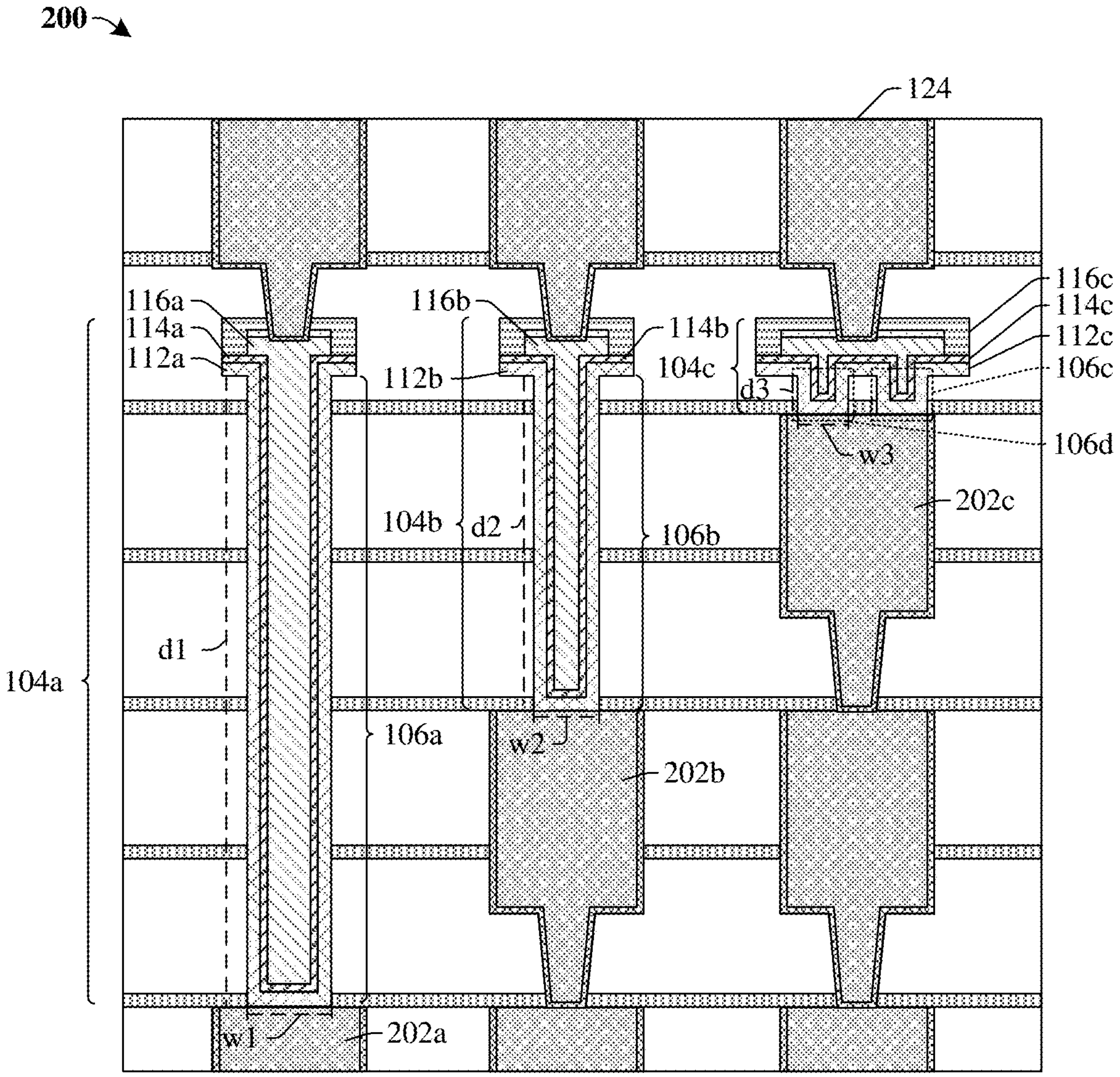
FIG. 2 illustrates a cross-sectional view of some additional embodiments of an integrated chip having a plurality of capacitors with bottom electrode structures of different depths and widths coupled to a plurality of wires beneath the capacitors.

FIG. 2 illustrates a cross-sectional view 200 of some additional embodiments of an integrated chip having a plurality of capacitors with bottom electrode structures of different depths and widths coupled to a plurality of wires beneath the capacitors.

In some embodiments, the bottom surfaces of the first bottom electrode structure 106*a* and the second bottom electrode structure 106*b* are contacting second wire levels 202*a*, 202*b*, 202*c* beneath the bottom surfaces. By using the first wire level 124 to contact the first top electrode 116*a* and the second wire levels 202*a*, 202*b*, 202*c* to contact the first bottom electrode structure 106*a*, the embodiment reduces the horizontal area of the first capacitor 104*a* used to connect both electrodes to the first wire level 124. Lowering the horizontal area used by individual capacitors may increase the density of capacitors in the integrated chip.

In some embodiments, a third capacitor 104*c* may have a third bottom electrode structure 106*c* and a fourth bottom electrode structure 106*d* extending to the second wire levels 202*a*, 202*b*, 202*c*. A third dielectric 114*c* separates the third bottom electrode structure 106*c* and the fourth bottom electrode structure 106*d* from a third top electrode 116*c*. The third bottom electrode structure 106*c* and the fourth bottom electrode structure 106*d* both add to the capacitance of the third capacitor 104*c*. The variance in the number of bottom electrode structures extending from the first, second and third bottom electrodes 112*a*, 112*b*, 112*c* expands the variety of different profiles that may achieve similar capacitances, and extends the range of capacitances that may be provided using this method.

In some embodiments, the first bottom electrode structure 106*a* may have the first width w1 and the first depth d1, the second bottom electrode structure 106*b* may have the second width w2 and the second depth d2, and the third and fourth bottom electrode structures 106*c*, 106*d* may have a third width w3 and a third depth d3. The difference in depths of the bottom electrode structures correlates to the difference in widths of the bottom electrode structures. That is, the first bottom electrode structure 106*a* has the first width w1 which is greater than the second width w2 of the second bottom electrode structure 106*b*, and also has the first depth d1 which is greater than the second depth d2 of the second bottom electrode structure 106*b*. The difference in widths w1, w2 results in a difference in the magnitude of etch-loading effects during the forming of the first and second capacitor 104*a*, 104*b*, leading to different etch rates and different depths d1, d2 for the first and second capacitor 104*a*, 104*b*. Therefore, the difference between the first depth d1 and the second depth d2 is a result of the difference between the first width w1 and the second width w2. The third and fourth bottom electrode structures 106*c*, 106*d* have the third width w3 that is less than the second width w2, and therefore have the third depth d3 which is less than the second depth d2.

FIGS. 3A-3D illustrate some additional embodiments 300*a*-300*d* of an integrated chip having capacitors with a plurality of bottom electrode structures of different depths and widths.

Figure 3A:
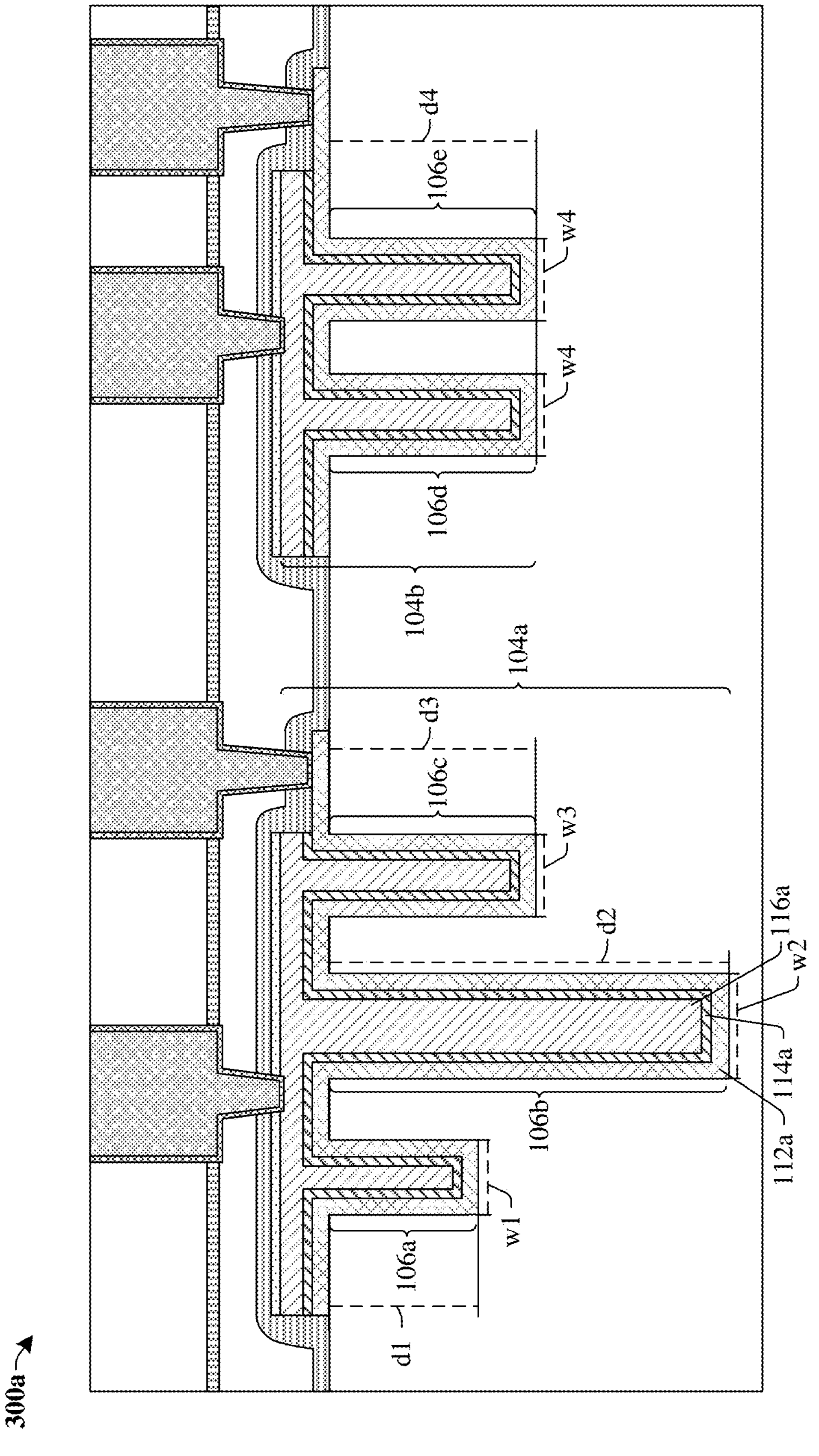
FIGS. 3A-3D illustrate cross-sectional views of some additional embodiments of an integrated chip having capacitors with a plurality of bottom electrode structures of different depths and widths.

As shown in the cross-sectional view 300*a* of FIG. 3A, in some embodiments, the first capacitor 104*a* may have the first bottom electrode structure 106*a*, the second bottom electrode structure 106*b*, and the third bottom electrode structure 106*c*. The first bottom electrode structure 106*a*, the second bottom electrode structure 106*b*, and the third bottom electrode structure 106*c* may respectively have the first depth d1, the second depth d2, and a third depth d3, and the first width w1, the second width w2, and a third width w3. The variance in the etch-loading effect during the etching process used before forming the first bottom electrode 112*a* results in the bottom electrode structure with a least width having a least depth and the bottom electrode structure with a greatest width having a greatest depth. For example, the first width w1 is less than the second width w2 and the third width w3. The second width w2 is greater than the third width w3. Therefore, the first bottom electrode structure 106*a* has the least width, resulting in the first depth d1 being the least depth (e.g., lower than the second depth d2 and the third depth d3). Further, the second bottom electrode structure 106*b* has the greatest width, resulting in the second depth d2 being the greatest depth (e.g., greater than the first depth d1 and the third depth d3).

In further embodiments, the second capacitor 104*b* may comprise the fourth bottom electrode structure 106*d* and a fifth bottom electrode structure 106*e*. The fourth bottom electrode structure 106*d* and the fifth bottom electrode structure may have a fourth width w4. That is, the fourth bottom electrode structure 106*d* may have a fourth width w4 that is substantially equal to the width of the fifth bottom electrode structure. The widths of the fourth bottom electrode structure 106*d* and the fifth bottom electrode structure 106*e* being substantially equal results in the depths of the fourth bottom electrode structure 106*d* and the fifth bottom electrode structure 106*e* being substantially equal. The fourth bottom electrode structure 106*d* and the fifth bottom electrode structure 106*e* have a fourth depth d4.

The first capacitor 104*a* and the second capacitor 104*b* may be part of a plurality of capacitors, which may respectively have a plurality of bottom electrode structures with depths different to the first, second, third, and fourth depths d1, d2, d3, d4. In some embodiments, the first bottom electrode structure 106*a* of the plurality of bottom electrode structures has a least width and a least depth. In further embodiments, bottom electrode structures of the plurality of bottom electrode structures with progressively greater widths up to a greatest width have progressively greater depths up to a greatest depth. In further embodiments, a second bottom electrode structure (e.g., the second bottom electrode structure 106*b*) of the plurality of bottom electrode structures has a median depth of the plurality of different depths and a median width of the plurality of different widths. A plurality of top electrodes extend between inner sidewalls of the plurality of bottom electrode structures.

In some embodiments, the first width w1 is between 80 nanometers and 120 nanometers, 95 and 105 nanometers, or the like. In some embodiments, the first depth d1 is between 500 nanometers and 800 nanometers, 625 and 675 nanometers, or the like. In some embodiments, the second width w2 is between 130 nanometers and 170 nanometers, 145 and 155 nanometers, or the like. In some embodiments, the second depth d2 is between 1000 nanometers and 1300 nanometers, 1100 and 1150 nanometers, or the like. In some embodiments, the third width w3 is between 90 nanometers and 130 nanometers, 105 and 115 nanometers, or the like. In some embodiments, the third depth d3 is between 750 nanometers and 1050 nanometers, 900 and 950 nanometers, or the like. In other embodiments, different ranges of widths and depths are used for one or more bottom electrode structures, and result in capacitors with different capacitances and cross-sectional profiles.

Figure 3B:
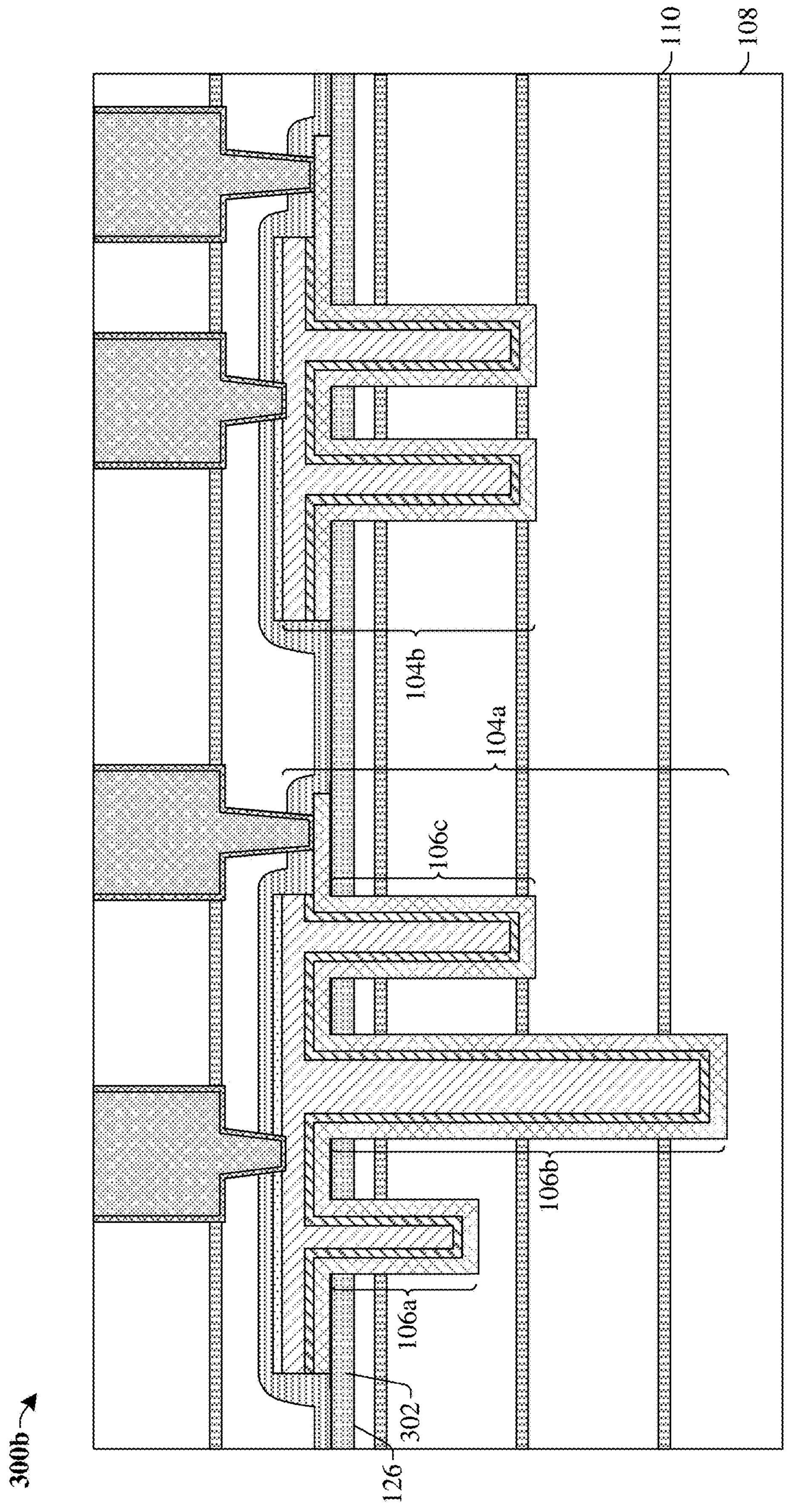

As shown in the cross-sectional view 300*b* of FIG. 3B, a hard mask 302 may be present over the upper surface 126 of the interlayer dielectric 108. In some embodiments, the hard mask 302 is or comprises silicon nitride ($Si_3N_4$) or the like. The hard mask 302 surrounds the plurality of bottom electrode structures of the first bottom electrode 112*a* and the second bottom electrode 112*b*. In some embodiments, the hard mask extends between the plurality of bottom electrode structures, including between the first bottom electrode structure 106*a* and the second bottom electrode structure 106*b*. In some embodiments, the hard mask 302 is left in place after the etching process used to form first and second trenches 308*a*, 308*b* (See FIG. 3D) in which the first and second bottom electrode structures 106*a*, 106*b* are subsequently formed, and has inner sidewalls that may correspond in a one-to-one fashion with the bottom electrodes. If present, this one-to-one correspondence evidences that the trenches in which the bottom electrodes were formed by a single etch using the hard mask 302, and the different depths of the trenches can evidence etch-loading effects and, hence, a very efficient manufacturing process.

Figure 3C:
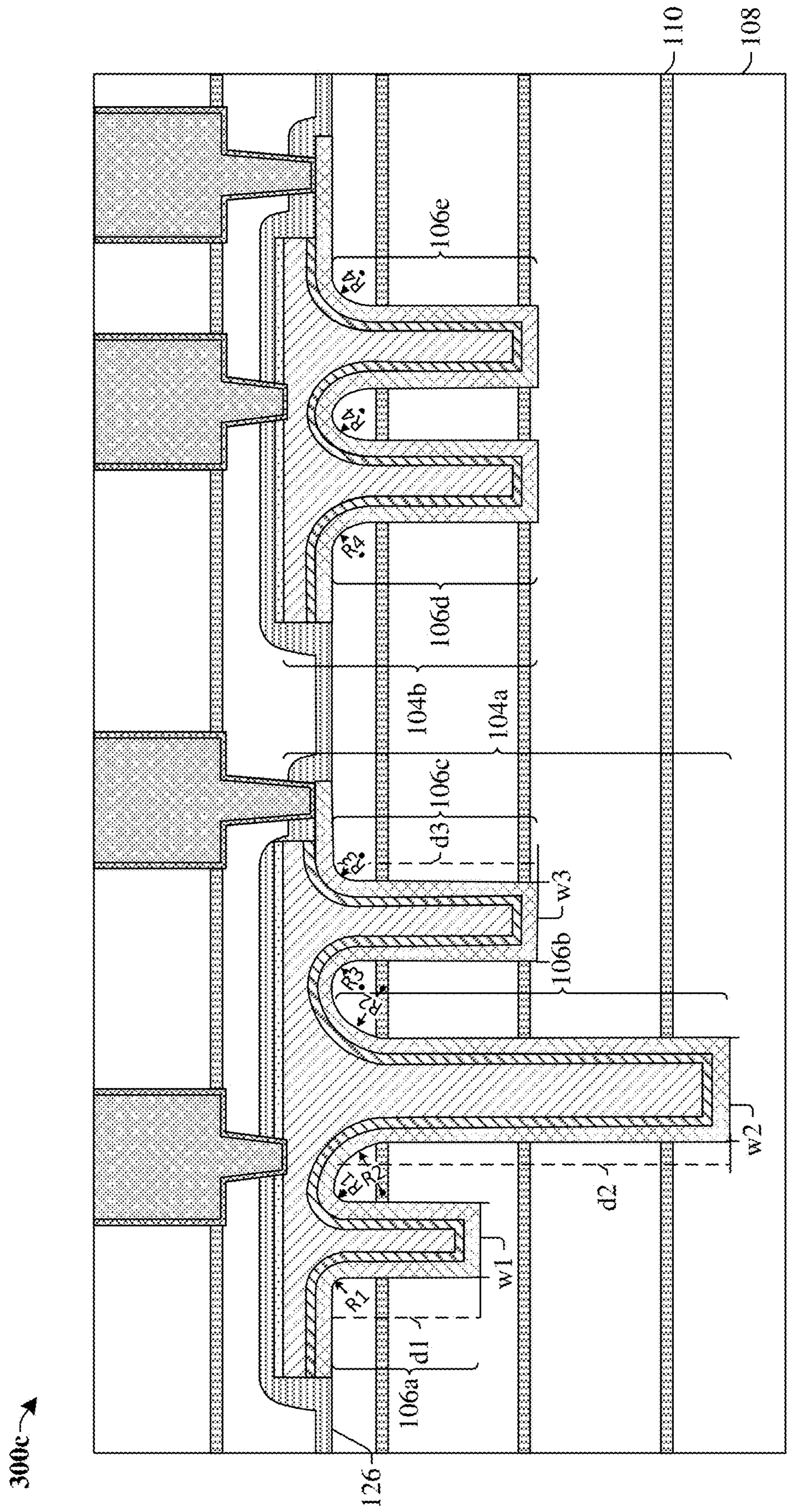

As shown in the cross-sectional view 300*c* of FIG. 3C, in some embodiments, outer sidewalls of the first bottom electrode 112*a* in the first bottom electrode structure 106*a*, the second bottom electrode structure 106*b*, and the third bottom electrode structure 106*c* may have different curvatures proximate to the upper surface 126 of the interlayer dielectric 108. For example, a first maximum radius of curvature R1 of the first bottom electrode structure 106*a* may be less than a second maximum radius of curvature R2 of the second bottom electrode structure 106*b*. Further, a third maximum radius of curvature R3 of the third bottom electrode structure 106*c* may be less than the second maximum radius of curvature R2 of the second bottom electrode structure 106*b* but greater than the first maximum radius of curvature R1 of the first bottom electrode structure 106*a*. In some embodiments, the radii of curvature may vary over corners of the bottom electrode structures. That is, the first bottom electrode structure 106*a* may have a radius of curvature at one position proximate to the upper surface 126 of the interlayer dielectric 108 that is less than the first maximum radius of curvature R1.

In some embodiments, the maximum radii of curvature R1, R2, R3 correlate to the widths w1, w2, w3 of the plurality of bottom electrode structures 106*a*, 106*b*, 106*c*, such that the bottom electrode structure with the least width (e.g., the first bottom electrode structure 106*a*) has the lowest maximum radius of curvature (e.g., the first maximum radius of curvature R1). Further, the bottom electrode structure with the greatest width (e.g., the second bottom electrode structure 106*b*) has the highest maximum radius of curvature (e.g., the third maximum radius of curvature R3). The fourth bottom electrode structure 106*d* and the fifth bottom electrode structure 106*e* of the second capacitor 104*b* have substantially equal widths w4, and therefore have substantially equal maximum radii of curvature R4. The difference in maximum radii of curvature R1, R2, R3, R4 between the plurality of bottom electrode structures may be the result of differing etch rates between the trenches 308*a*, 308*b* (See FIG. 3D) formed prior to the formation of the bottom electrode structures.

Figure 3D:
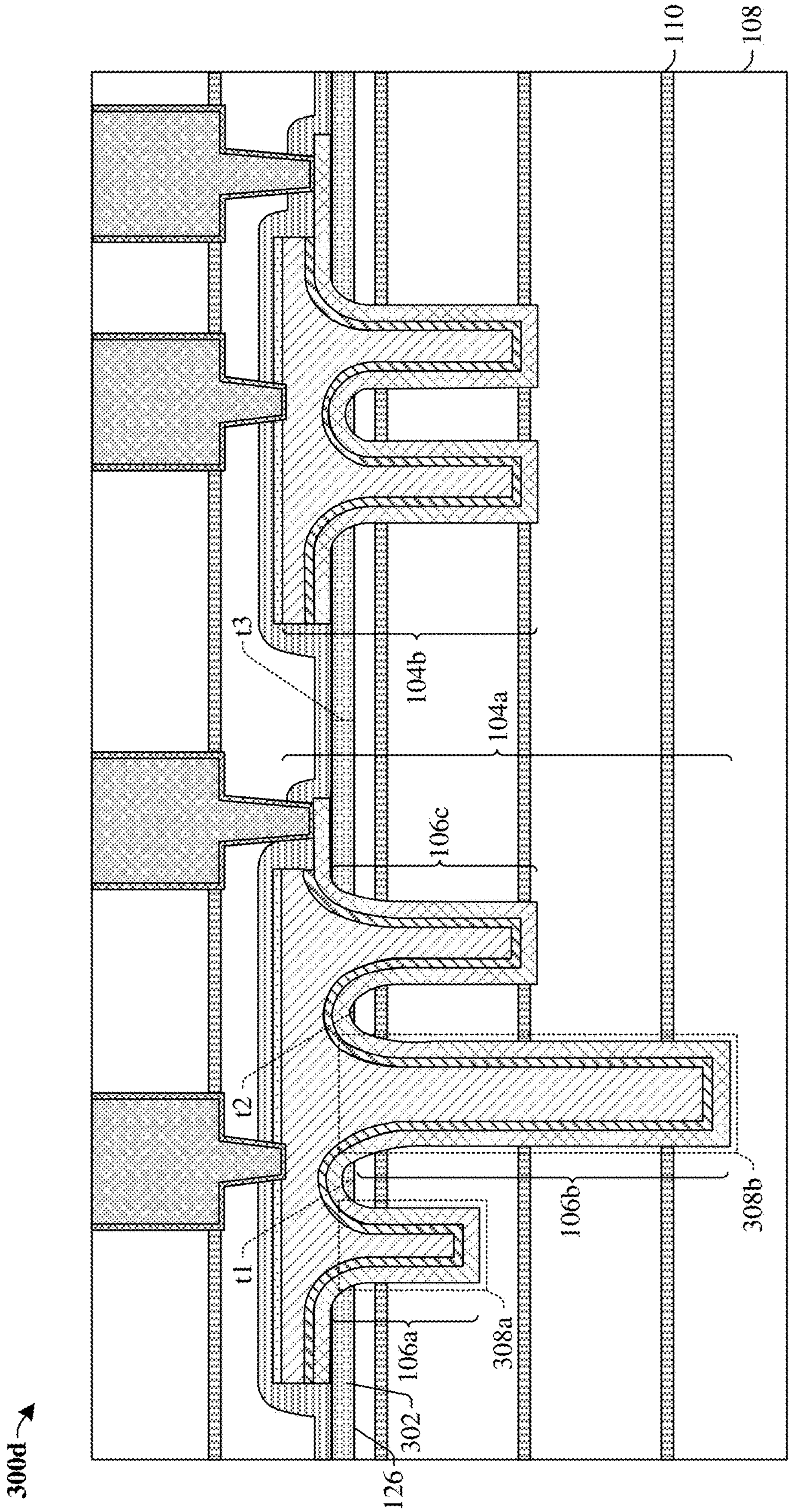

As shown in the cross-sectional view 300*d* of FIG. 3D, in some embodiments, thicknesses of the hard mask 302 directly between the first, second, and third bottom electrode structures 106*a*, 106*b*, 106*c* are lower than the thickness of the hard mask 302 between the first capacitor 104*a* and the second capacitor 104*b*. For example, a first thickness t1 of the hard mask 302 measured between the first bottom electrode structure 106*a* and the second bottom electrode structure 106*b* is less than a second thickness t2 of the hard mask 302 measured between the first capacitor 104*a* and the second capacitor 104*b*. Further, a third thickness t3 of the hard mask 302 measured between the second bottom electrode structure 106*b* and the third bottom electrode structure 106*c* is less than the first thickness t1 and the second thickness t2.

The difference in thicknesses between the first thickness t1, the second thickness t2, and the third thickness t3 is based on the etch-loading effects present in the etching of the first and second trenches 308*a*, 308*b* surrounding the first thickness t1 and the second thickness t2. The etch rate of the interlayer dielectric 108 and the hard mask 302 is lower for a first trench 308*a* filled by the first bottom electrode structure 106*a* than a second trench 308*b* filled by the second bottom electrode structure 106*b*. The difference in etch rates is due to the first trench 308*a* having a first width w1 less than the second width w2 of the second trench 308*b*. The width w1 being less than the width w2 results in a lower amount of etchant reacting with the hard mask and the interlayer dielectric in the first trench 308*a*, which further results in the removal of less material near the opening of the first trench 308*a* compared to the second trench 308*b*. The removal of a greater amount of material at the opening of the second trench 308*b* may result in upper portions of the hard mask being removed. The portions of the hard mask 302 directly between the plurality of bottom electrode structures (e.g., between the first bottom electrode structure 106*a* and the second bottom electrode structure 106*b*) may be etched from multiple directions, which may lead to a greater amount of the hard mask being etched and lead to a decrease in the thickness of the hard mask 302 at those positions.

Figure 4A:
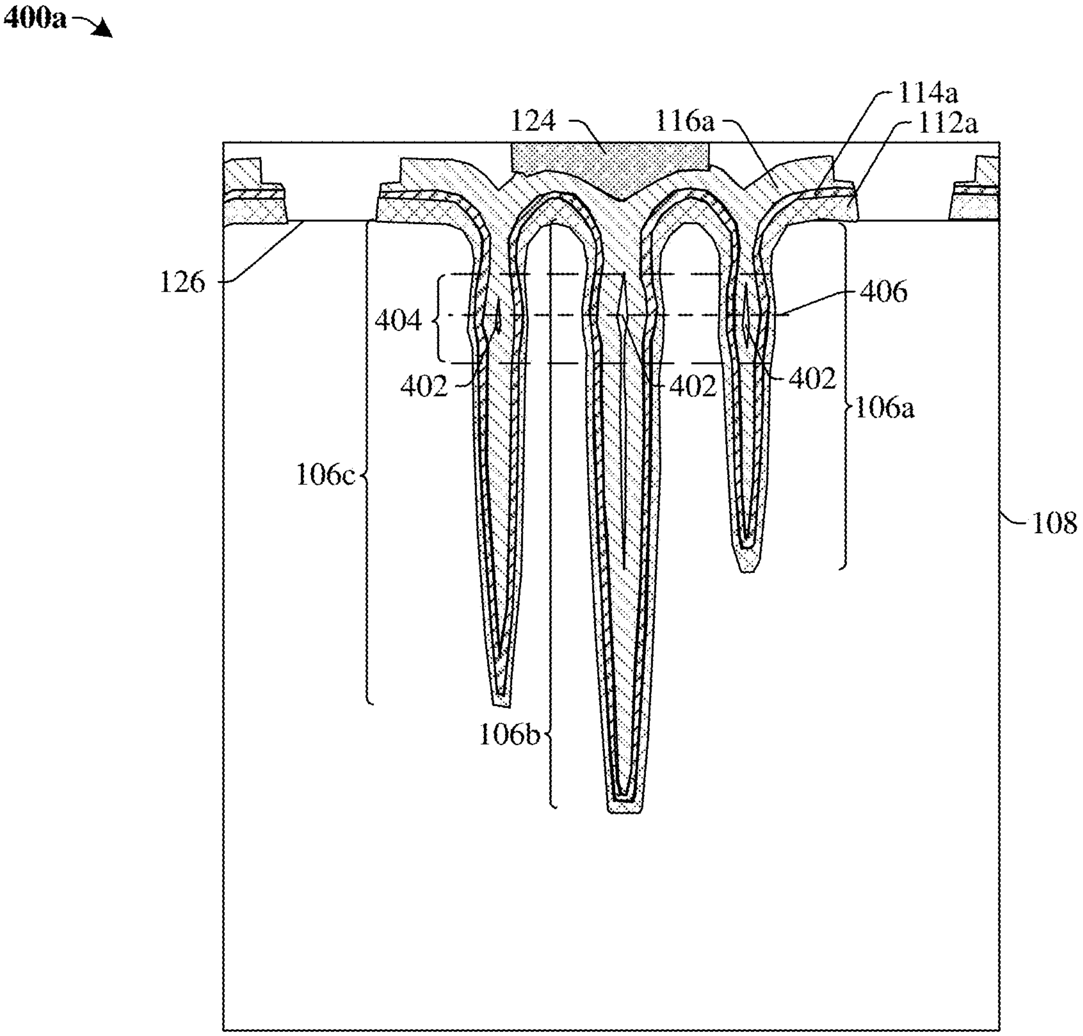
FIGS. 4A-4C illustrate cross-sectional views and a graph of some additional embodiments of an integrated chip having capacitors with a plurality of bottom electrode structures of different depths and widths.
Figure 4B:
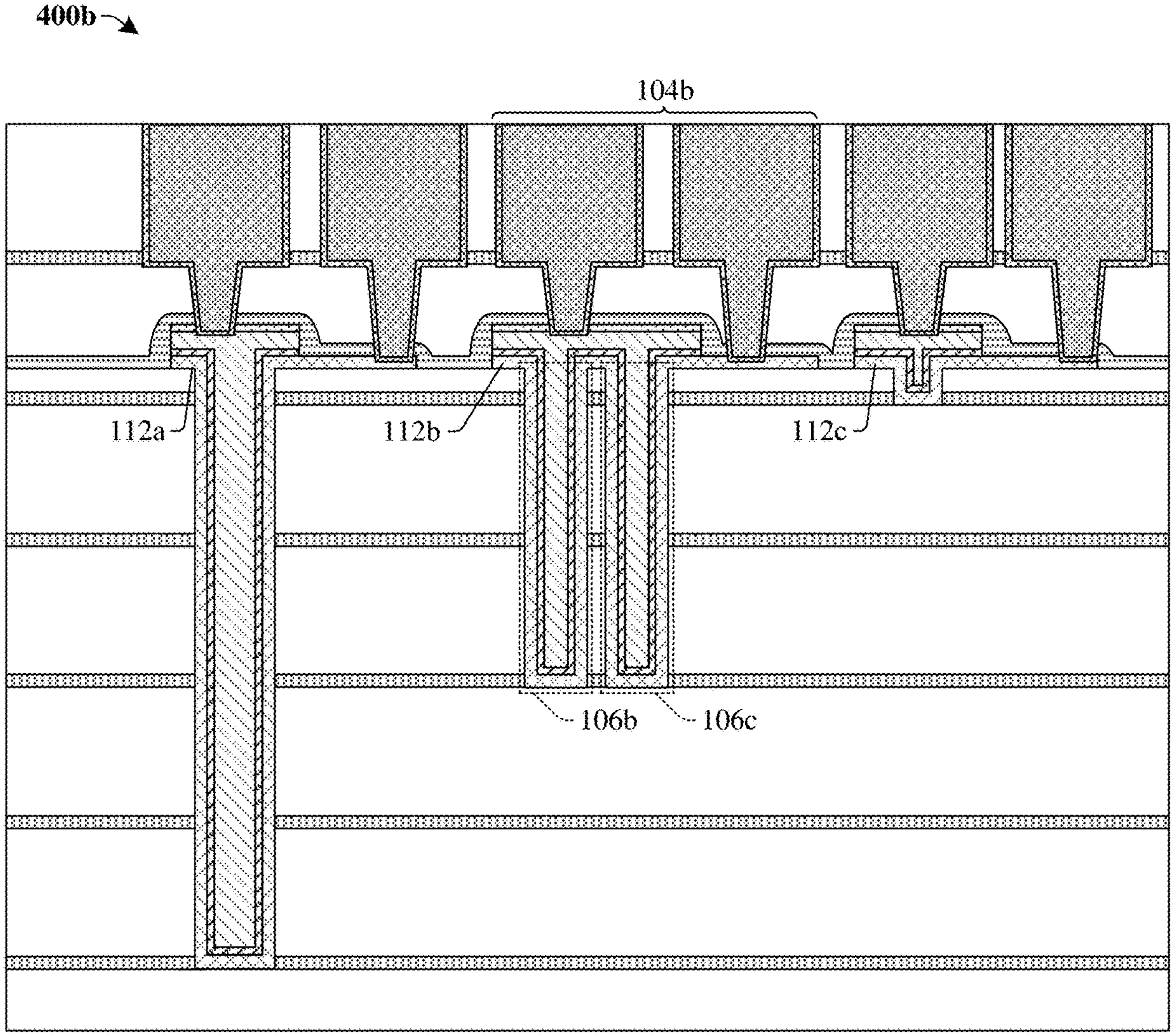
Figure 4C:
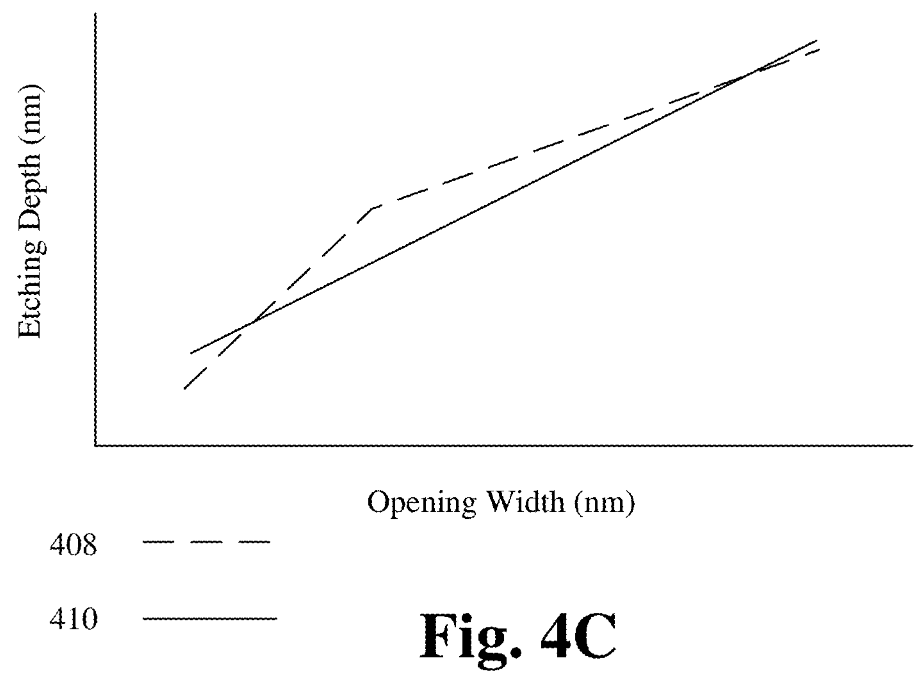

FIGS. 4A-4C illustrate cross-sectional views 400*a*, 400*b* and a graph 400*c* of some additional embodiments of an integrated chip having capacitors with a plurality of bottom electrode structures of different depths and widths.

As shown in FIG. 4A, in some embodiments, gaps 402 may be present in the plurality of bottom electrode structures. In some embodiments, the plurality of bottom electrode structures may have bulbs 404 where the width of the plurality of bottom electrode structures is at a local maximum. The bulbs 404 are segments of the plurality of bottom electrode structures where the widths of the bottom electrode structures increase up to a middle line 406 going through the local maxima of the widths. The widths then decrease back to a width that the bottom electrode structures had before the widths began to increase at the bulbs 404. The bulbs 404 in the plurality of bottom electrode structures are proximate to the upper surface 126 of the interlayer dielectric 108. In further embodiments, the middle line 406 of the bulbs 404 is at a depth below the upper surface 126 of the interlayer dielectric 108 that is independent of the depths of the plurality of bottom electrode structures. That is, the middle line 406 extends through the maximum width of the bulbs 404 in the first bottom electrode structure 106*a*, the second bottom electrode structure 106*b* and the third bottom electrode structure 106*c*, and is substantially parallel to the upper surface 126 of the interlayer dielectric 108.

As shown in FIG. 4B, in some embodiments, the second capacitor 104*b* may have a second bottom electrode structure 106*b* and a third bottom electrode structure 106*c* extending beneath the first wire level 124. The variance in the number of bottom electrode structures extending from the first, second and third bottom electrodes 112*a*, 112*b*, 112*c* expands the variety of different profiles that may achieve similar capacitances, and extends the range of capacitances that may be provided using this method of fabrication.

As shown in FIG. 4C, there is a positive correlation between the etching depth and the opening width during the etching process. That is, for a range of opening widths, trenches with a greater opening width will have a greater etching depth for the same etching process. Line 408 shows the etching depths and opening widths of FIG. 4A, while line 410 shows a trendline of the data shown in line 408.

FIGS. 5-11 illustrate cross-sectional views 500-1100 of some embodiments of a method of forming an integrated chip having a plurality of capacitors with bottom electrode structures of different depths and widths. Although FIGS. 5-11 are described in relation to a method, it will be appreciated that the structures disclosed in FIGS. 5-11 are not limited to such a method, but instead may stand alone as structures independent of the method.

Figure 5:
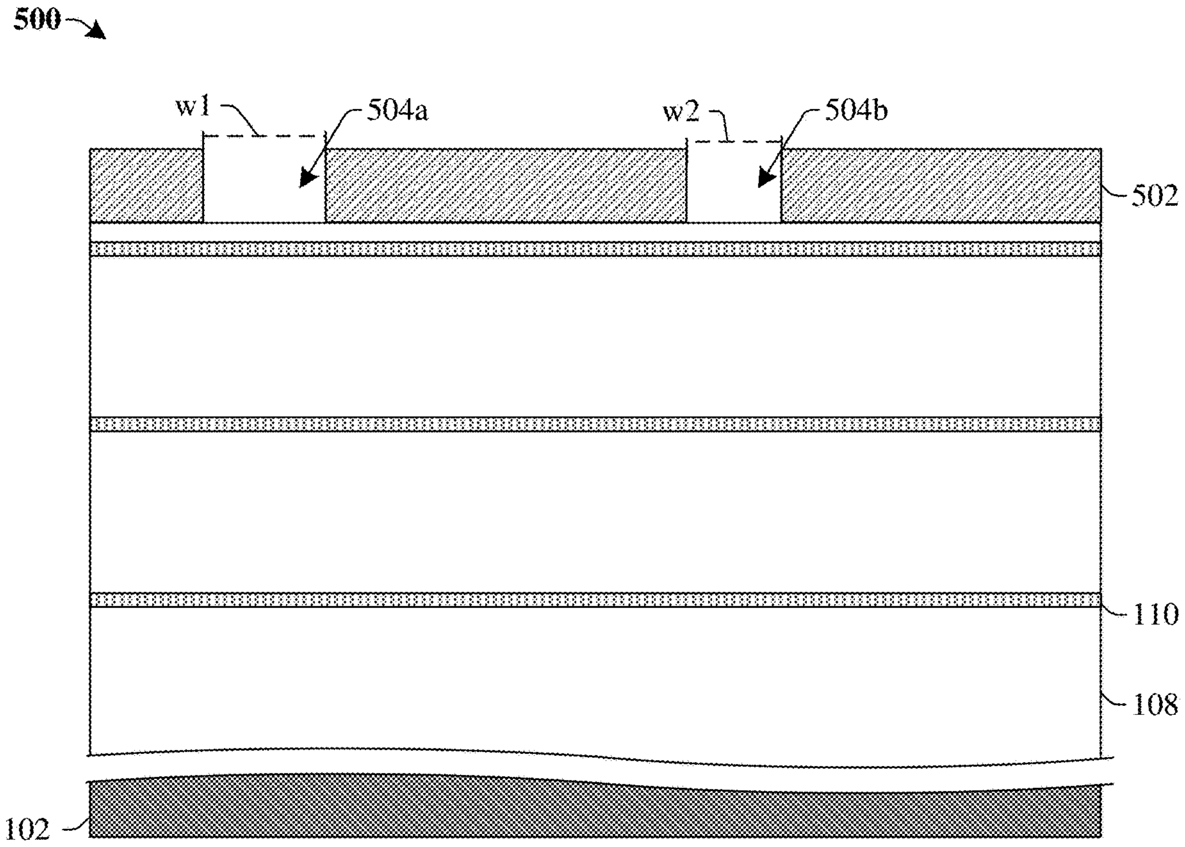
FIGS. 5-11 illustrate cross-sectional views of some embodiments of a method of forming an integrated chip having a plurality of capacitors with bottom electrode structures of different depths and widths.

As shown in cross-sectional view 500 of FIG. 5, the substrate 102 is provided. The interlayer dielectric 108 is on the substrate 102, and in some embodiments is periodically interleaved with the etch stop layers 110. A first masking layer 502 is formed on the interlayer dielectric 108. In some embodiments, the first masking layer 502 is a photoresist formed using a spin-on process. In other embodiments, the first masking layer 502 is a hard mask 302 formed using one of chemical vapor deposition (CVD), physical vapor deposition (PVD), atomic layer deposition (ALD), some other suitable deposition process, or a combination of the foregoing. The first masking layer 502 is then patterned, resulting in a first opening 504*a* and a second opening 504*b*. In some embodiments, the first masking layer 502 is patterned using photolithography. The first opening has the first width w1 and the second opening has the second width w2 that is less than the first width w1.

Figure 6:
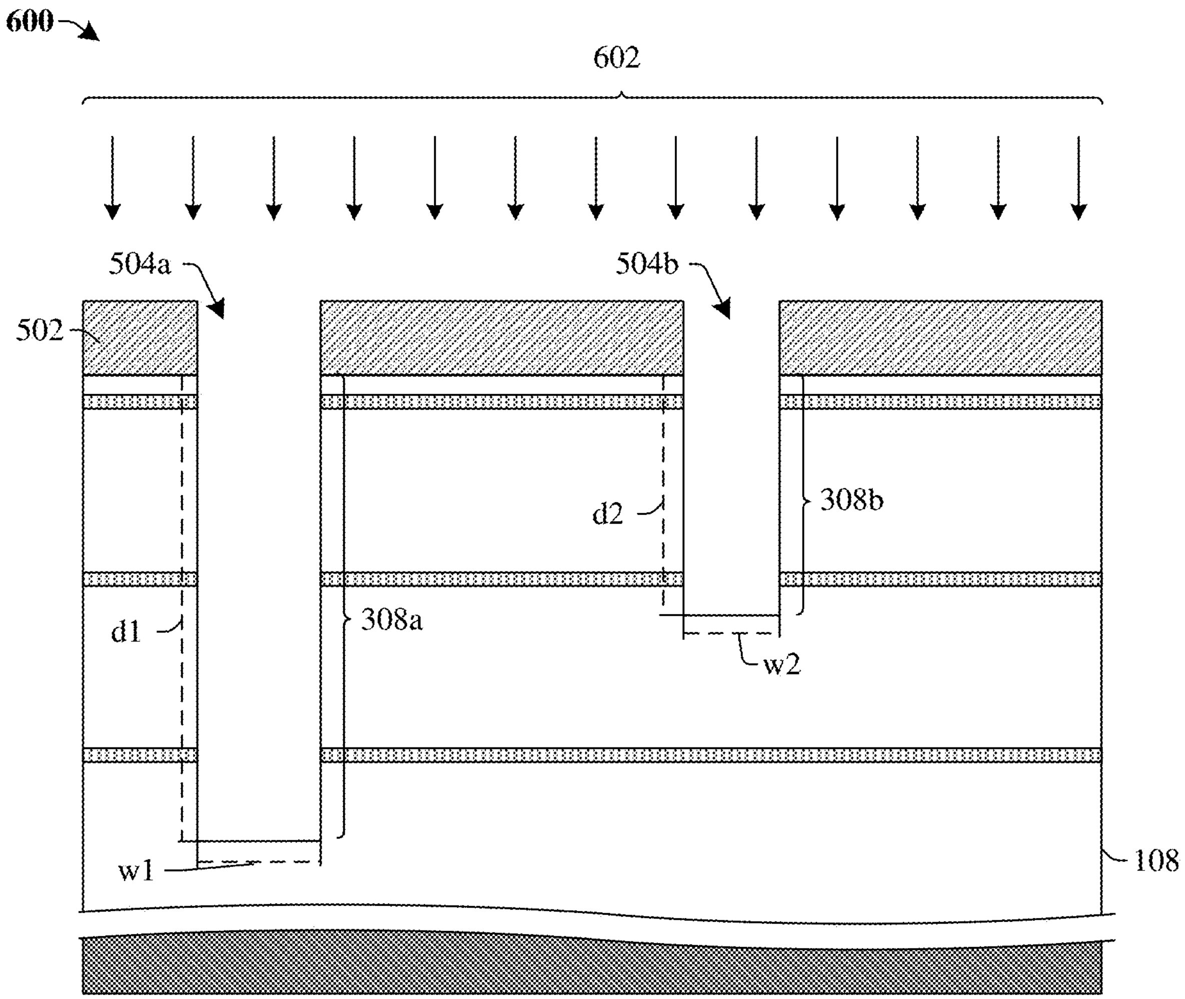

As shown in cross-sectional view 600 of FIG. 6, a first etching process 602 is performed. During the first etching process 602, the interlayer dielectric 108 is etched in the regions that are exposed by the first opening 504*a* and the second opening 504*b* in the first masking layer 502. In some embodiments, first etching process 602 may be a dry etch such as a plasma etch or the like. The first etching process 602 results in a first trench 308*a* formed beneath the first opening 504*a* and a second trench 308*b* formed beneath the second opening 504*b*. The first trench 308*a* has the first width w1 and is etched to the first depth d1, and the second trench 308*b* has the second width w1 and is etched to the second depth d2. The second depth d2 is less from the first depth d1 due to a difference in the etch rate in the first and second trenches 308*a*, 308*b*. The difference in etch rates is due to the second width w2 being less from the first width w1. The lower width of the second trench 308*b* results in less etchant reaching the bottom of the second trench 308*b* compared to the amount of etchant that may reach the bottom of the first trench 308*a* during the etching process. As the etch rates of the first trench 308*a* and the second trench 308*b* are respectively dependent on the width of the first opening 504*a* and the second opening 504*b*, the first trench 308*a* and the second trench 308*b* may be formed with different depths during a single etching process and using the same mask.

Figure 7:
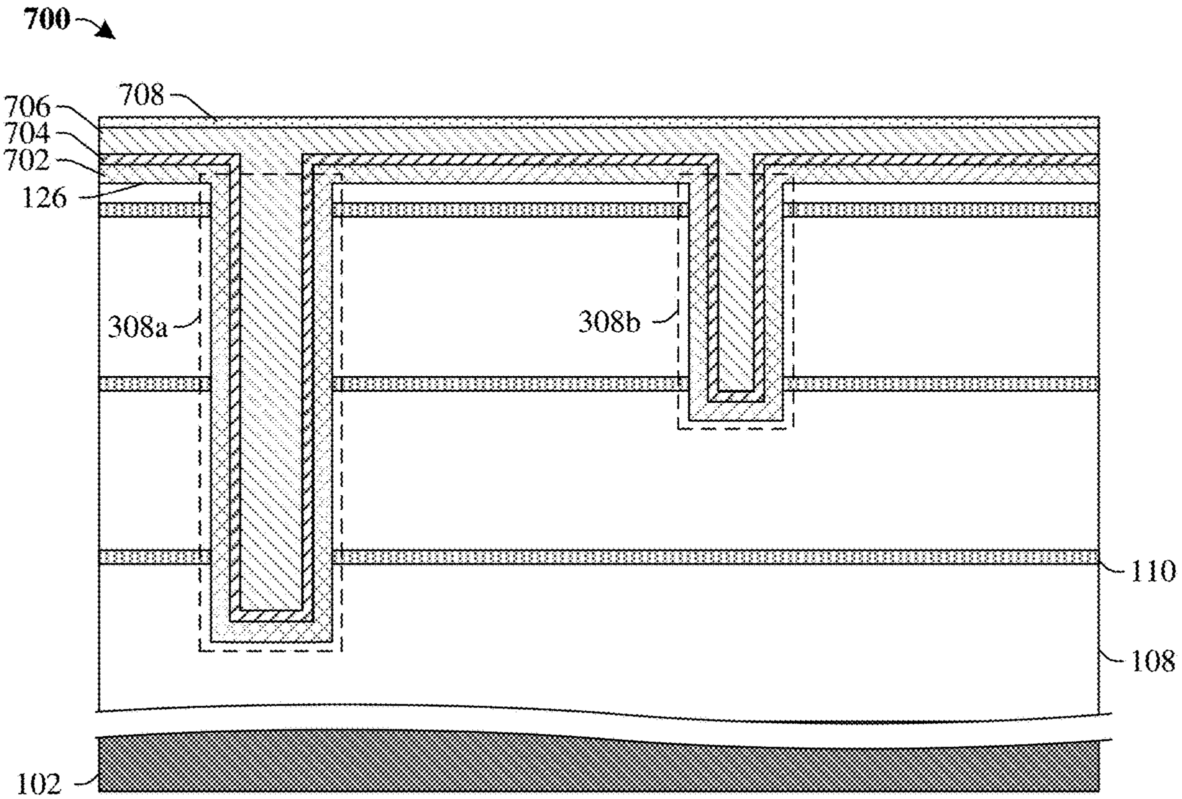

As shown in cross-sectional view 700 of FIG. 7, a first conformal electrode layer 702, a conformal dielectric 704, a second conformal electrode layer 706, and a conformal ARC layer 708 are deposited over the upper surface 126 of the interlayer dielectric 108. In some embodiments, the first conformal electrode layer 702, the conformal dielectric 704, the second conformal electrode layer 706, and the conformal ARC layer 708 may be deposited using one of CVD, PVD, ALD, some other suitable deposition process, or a combination of the foregoing. In some embodiments, the first masking layer 502 (see FIG. 6) is removed prior to the formation of the first conformal electrode layer 702. In other embodiments, the first masking layer 502 is a hard mask and is not removed before forming the first conformal electrode layer 702. The first conformal electrode layer 702, the conformal dielectric 704, and the second conformal electrode layer 706 extend in to the first trench 308*a* and the second trench 308*b*. The conformal dielectric 704 overlies the first conformal electrode layer 702 and separates the first conformal electrode layer 702 from the second conformal electrode layer 706. In some embodiments, the first conformal electrode layer 702 and the second conformal electrode layer 706 are or comprise one of copper (Cu), titanium (Ti), titanium nitrate (TiN), tungsten (W), aluminum (Al), tantalum nitrate (TaN), the like, or any combination of the foregoing. In some embodiments, the conformal dielectric 704 is or comprises one of silicon oxide ($SiO_2$), silicon nitride ($Si_3N_4$), a high-k dielectric, the like, or some combination of the foregoing.

Figure 8:
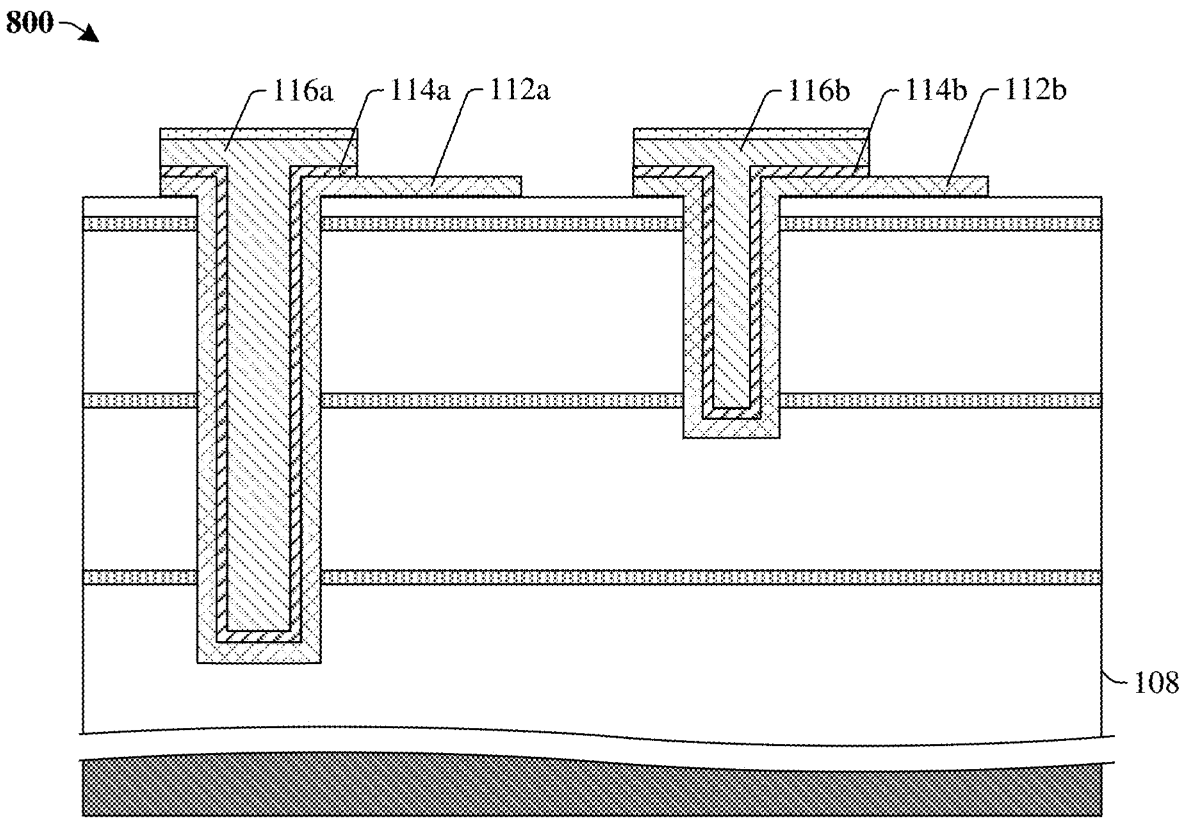

As shown in cross-sectional view 800 of FIG. 8, the first conformal electrode layer 702, the conformal dielectric 704 (see FIG. 7), the second conformal electrode layer 706 (see FIG. 7), and the conformal ARC layer 708 (see FIG. 7) are etched, resulting in the first bottom electrode 112*a*, the second bottom electrode 112*b*, the first dielectric 114*a*, the second dielectric 114*b*, the first top electrode 116*a*, and the second top electrode 116*b*. In some embodiments, etch may be a plasma etch or the like. In some embodiments, a portion of the upper surfaces of the first bottom electrode 112*a* and the second bottom electrode 112*b* are exposed and will be coupled to the first wire level 124 (see FIG. 1) above the first bottom electrode 112*a* as shown in later steps (see FIG. 11). In other embodiments, the upper surfaces of the first bottom electrode 112*a* and the second bottom electrode 112*b* are completely covered by the first dielectric 114*a* and the second dielectric 114*b*. Further, bottom surfaces of the first bottom electrode 112*a* and the second bottom electrode 112*b* are formed such that they contact the second wire levels 202*a*, 202*b*, 202*c* (see FIG. 2) below the bottom electrodes.

Figure 9:
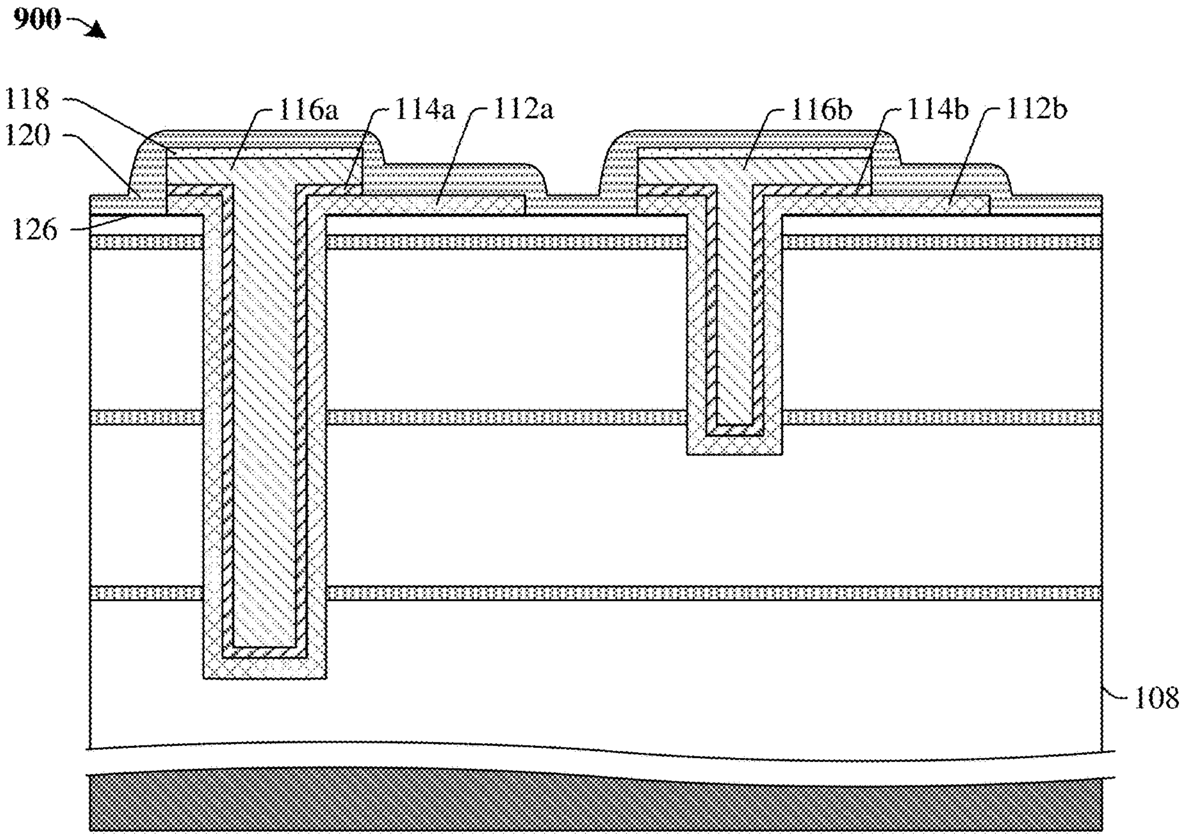

As shown in cross-sectional view 900 of FIG. 9, a passivation layer 120 is deposited over the upper surface 126 of the interlayer dielectric 108. The passivation layer 120 may be deposited using CVD, PVD, ALD, some other suitable deposition process, or a combination of the foregoing. The passivation layer 120 conformally overlies the ARC 118, the first and second bottom electrodes 112*a*, 112*b*, the first and second dielectric 114*a*, 114*b*, the first and second top electrodes 116*a*, 116*b*, and the upper surface 126 of the interlayer dielectric 108.

Figure 10:
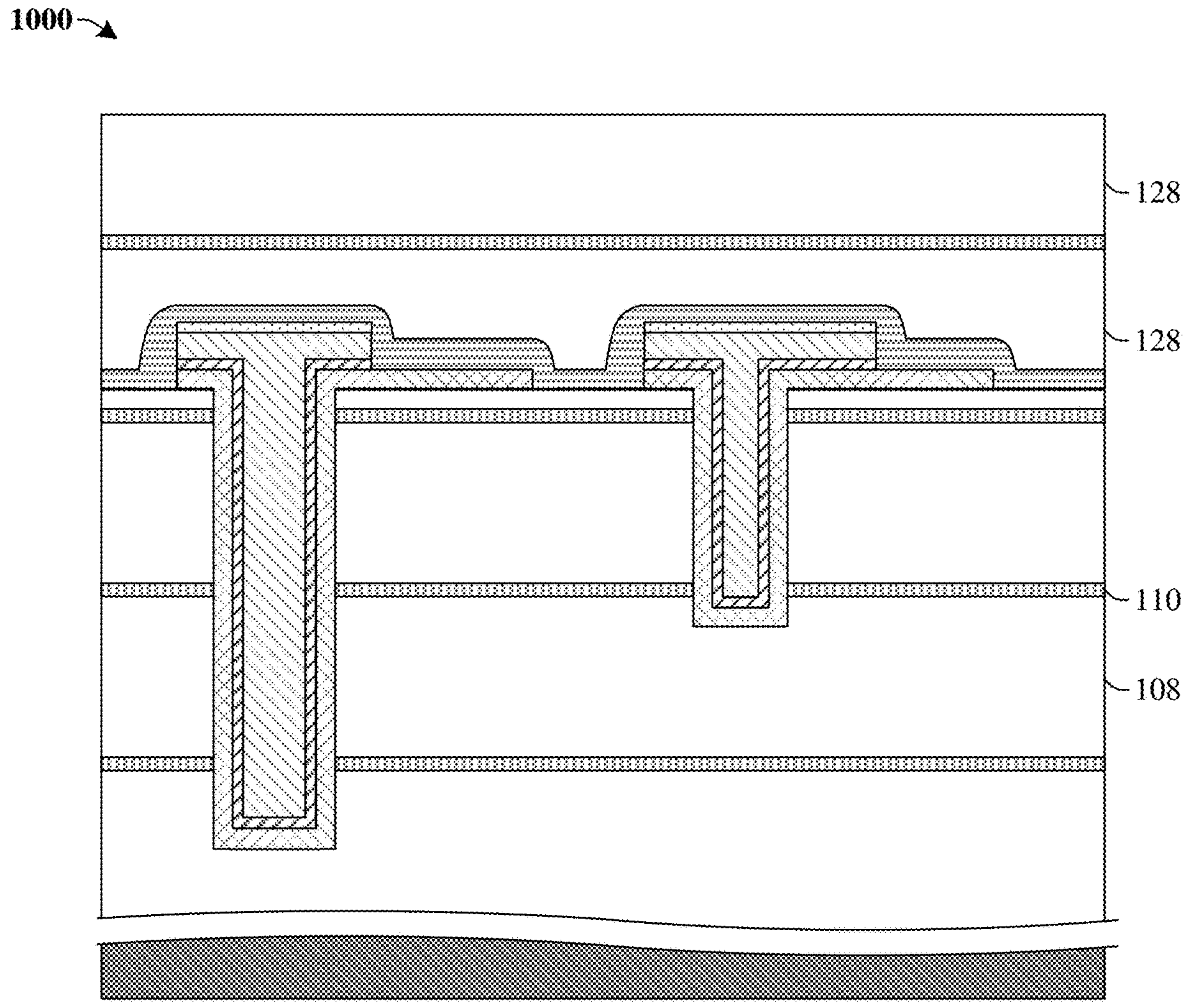

As shown in the cross-sectional view 1000 of FIG. 10, additional dielectric layers 128 are formed over the upper surface of the interlayer dielectric 108. In some embodiments, the additional dielectric layers 128 comprise a same material as the interlayer dielectric 108. In some embodiments, the additional dielectric layers 128 are formed using one of CVD, PVD, ALD, some other suitable deposition process, or a combination of the foregoing.

Figure 11:
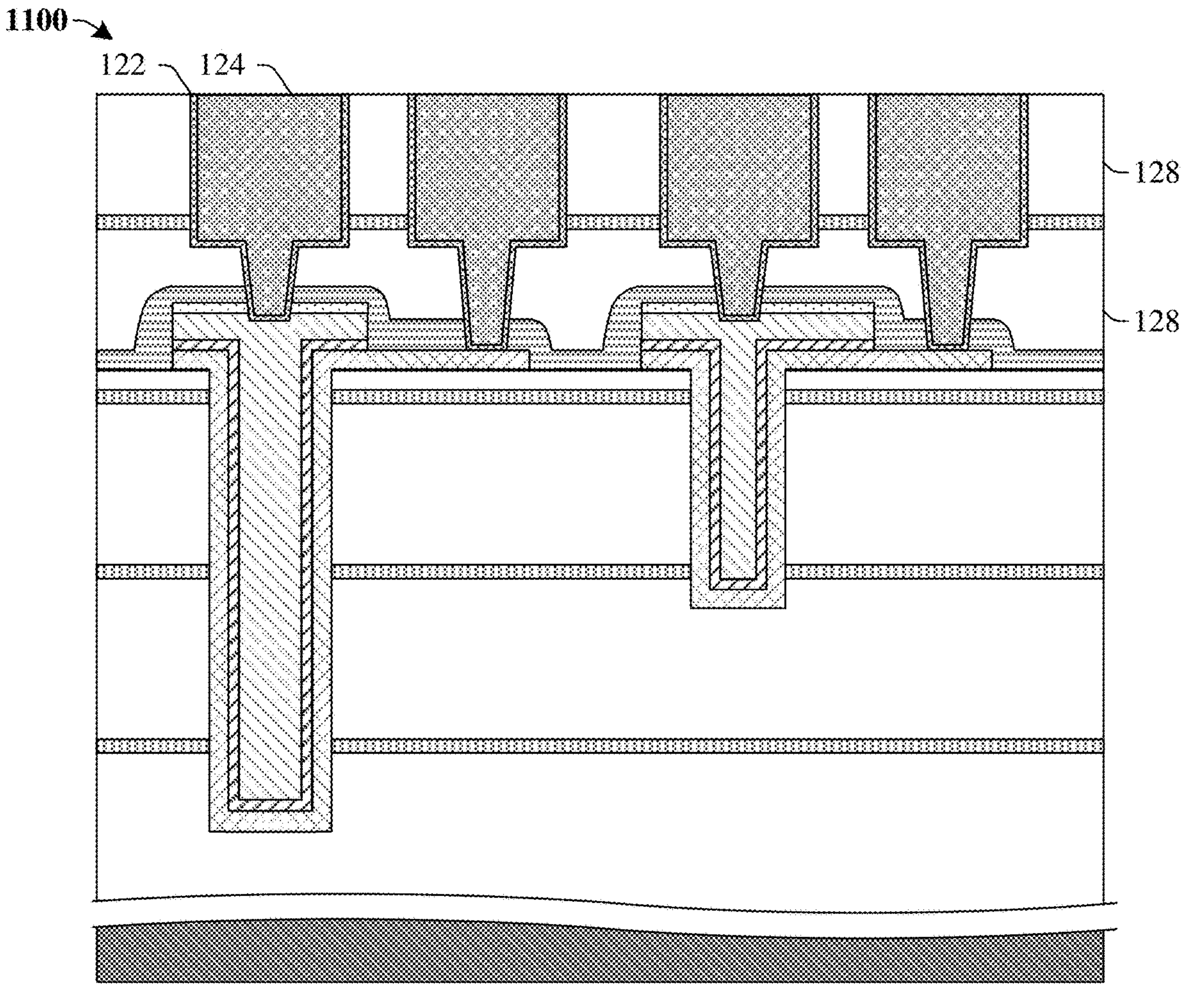

As shown in the cross-sectional view 1100 of FIG. 11, a first barrier layer 122 and a first wire level 124 are formed in the additional dielectric layers 128. In some embodiments, the first barrier layer 122 and the first wire level 124 are formed using multiple etching processes to form openings. The openings are then filled with a conformal barrier layer (not shown) and a conformal conductive layer (not shown). A planarization process (e.g., a chemical mechanical planarization (CMP) process) is then performed, removing portions of the conformal barrier layer and the conformal conductive layer that are above an upper surface of the additional dielectric layers 128.

Figure 12:
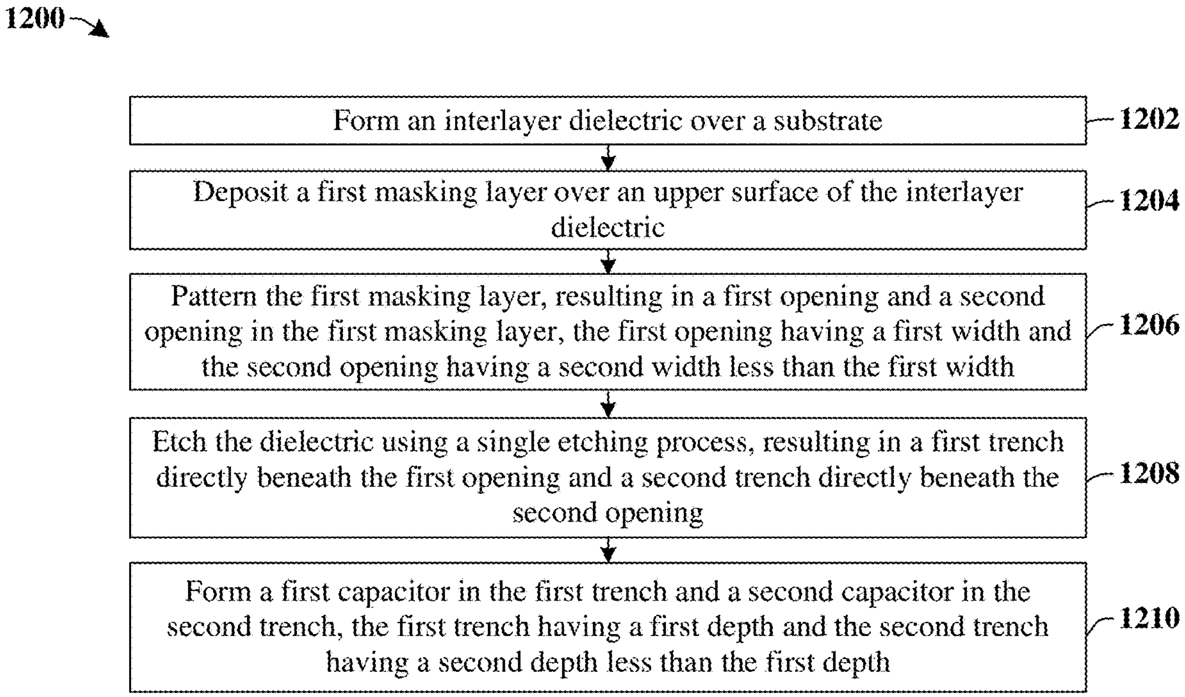
FIG. 12 illustrates a flow diagram of some embodiments of a method of forming an integrated chip having a plurality of capacitors with bottom electrode structures of different depths and widths.

FIG. 12 illustrates a flow diagram of some embodiments of a method of forming an integrated chip having a plurality of capacitors with bottom electrodes of different depths and widths.

While method 1200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, an interlayer dielectric is formed over a substrate. FIG. 5 illustrates a cross-sectional view 500 of some embodiments corresponding to act 1202.

At 1204, a photoresist is deposited over an upper surface of the interlayer dielectric. FIG. 5 illustrates a cross-sectional view 500 of some embodiments corresponding to act 1204.

At 1206, the photoresist is patterned, resulting in a first opening and a second opening in the photoresist, the first opening having a first width and the second opening having a second width less than the first width. FIG. 6 illustrates a cross-sectional view 600 of some embodiments corresponding to act 1206.

At 1208, the dielectric is etched using a single etching process, resulting in a first trench directly beneath the first opening and a second trench directly beneath the second opening. FIG. 7 illustrates a cross-sectional view 700 of some embodiments corresponding to act 1208.

At 1210, a first capacitor is formed in the first trench and a second capacitor is formed in the second trench, the first trench having a first depth and the second trench having a second depth less than the first depth. FIGS. 7-11 illustrates cross-sectional views 700-1100 of some embodiments corresponding to act 1210.

Therefore, the present disclosure relates to a new method of forming an integrated chip having a plurality of capacitors with bottom electrode structures of different depths and widths.

Accordingly, in some embodiments, the present disclosure relates to an integrated device, including a substrate; an interconnect structure disposed over the substrate, the interconnect structure including an interlayer dielectric; a first bottom electrode structure disposed in the interlayer dielectric, the first bottom electrode structure having a first width as measured between outer sidewalls of the first bottom electrode structure and a first depth as measured from an upper surface of the interlayer dielectric; and a second bottom electrode structure disposed in the interlayer dielectric and spaced apart from the first bottom electrode structure, the second bottom electrode structure having a second width as measured between outer sidewalls of the second bottom electrode structure and a second depth as measured from the upper surface of the interlayer dielectric; where the first width is greater than the second width and the first depth is greater than the second depth.

In other embodiments, the present disclosure relates to a capacitor array, including a plurality of capacitors arranged in an interconnect structure, the capacitors comprising horizontal portions of bottom electrodes arranged at a first elevation; a plurality of bottom electrode structures of the plurality of capacitors extending from the horizontal portions of the bottom electrodes, the plurality of bottom electrode structures extending to a plurality of different depths measured from the first elevation, including a least depth and a greatest depth of the plurality of different depths, and having a plurality of different widths measured between outer sidewalls of the plurality of bottom electrode structures, including a least width and a greatest width of the plurality of different widths; where a first bottom electrode structure of the plurality of bottom electrode structures has the least depth and the least width, and wherein bottom electrode structures of the plurality of bottom electrode structures with progressively greater depths up to the greatest depth have progressively greater widths up to the greatest width.

In yet other embodiments, the present disclosure relates to a method of forming capacitors in an integrated device, including forming a dielectric over a substrate; depositing a photoresist over an upper surface of the dielectric; patterning the photoresist, resulting in a first opening and a second opening in the photoresist, the first opening having a first width and the second opening having a second width less than the first width; etching the dielectric using a single etching process, resulting in a first trench directly beneath the first opening and a second trench directly beneath the second opening; and forming a first capacitor in the first trench and a second capacitor in the second trench, the first trench having a first depth and the second trench having a second depth less than the first depth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming capacitors in an integrated device, comprising:

forming an interlayer dielectric over a substrate;

depositing a first masking layer over an upper surface of the interlayer dielectric;

patterning the first masking layer, resulting in a first opening, a second opening, and a third opening in the first masking layer, the first opening having a first width, the second opening having a second width less than the first width, and the third opening arranged laterally between the first opening and the second opening and having a third width greater than the first width;

etching the interlayer dielectric using a single etching process, resulting in a first trench directly beneath the first opening, a second trench directly beneath the second opening, and a third trench directly beneath the third opening; and forming a first capacitor in the first trench and a second capacitor in the second trench and the third trench, the first trench having a first depth, the second trench having a second depth less than the first depth, and the third trench having a third depth greater than the first depth.

2. The method of claim 1, wherein the single etching process etches the first trench, the second trench, and the third trench.

3. The method of claim 1, wherein the first trench and the third trench extend through one or more etch stop layers within the interlayer dielectric.

4. The method of claim 1, further comprising:

forming a first plurality of vias after forming the first capacitor and the second capacitor; and forming a first plurality of wires, wherein bottom electrodes of the first capacitor and the second capacitor are coupled to the first plurality of wires by the first plurality of vias and top electrodes of the first capacitor and the second capacitor are coupled to the first plurality of wires by the first plurality of vias.

5. The method of claim 1, wherein forming the first capacitor and the second capacitor further comprises forming a first horizontal portion of the first capacitor and a second horizontal portion of the second capacitor, and wherein the first horizontal portion has a first area and the second horizontal portion has a second area different from the first area.

6. The method of claim 1, wherein the second capacitor comprises horizontally-extending regions on opposing sides of the second trench and the third trench, and wherein the horizontally-extending regions are vertically separated from the upper surface of the interlayer dielectric by the first masking layer.

7. The method of claim 1, wherein after etching the interlayer dielectric, the first masking layer has a first thickness between the first opening and the third opening and has a second thickness between the second opening and the third opening, wherein the first thickness is greater than the second thickness, and wherein the first masking layer comprises a hard mask layer.

8. A method of forming capacitors in an integrated device, comprising:

forming an interlayer dielectric over a substrate;

depositing a first masking layer over a first upper surface of the interlayer dielectric;

patterning the first masking layer, resulting in a first opening and a second opening in the first masking layer, the first opening having a first width and the second opening having a second width less than the first width;

etching the interlayer dielectric, resulting in a first trench at the first opening and extending to a first depth beneath the first upper surface and a second trench at the second opening and extending to a second depth beneath the first upper surface, wherein the etching of the interlayer dielectric further results in the first upper surface of the interlayer dielectric having a first curved segment and a second curved segment, wherein the first curved segment has a first radius of curvature and extends from a first sidewall of the interlayer dielectric in the first trench, and wherein the second curved segment has a second radius of curvature less than the first radius of curvature and extends from a second sidewall of the interlayer dielectric in the second trench;

depositing a first electrode layer conforming to sidewalls of the first trench and the second trench and having a bottom surface at the first depth and the second depth; and subsequently depositing a dielectric layer and a second electrode layer over the first electrode layer, thereby filling the first trench and the second trench.

9. The method of claim 8, further comprising:

etching the second electrode layer and the dielectric layer, resulting in a first top electrode and a first dielectric overlying the first electrode layer and having first sidewalls facing a first direction and second sidewalls facing a second direction, the first sidewalls and the second sidewalls overlying the first electrode layer; and etching the first electrode layer, resulting in a first bottom electrode extending past the first sidewalls of the first top electrode and the first dielectric in the first direction and having a sidewall aligned with the second sidewalls of the first top electrode and the first dielectric in the second direction.

10. The method of claim 9, further comprising:

forming a first wire level over the first top electrode and the first bottom electrode, wherein the first wire level comprises a first wire electrically coupled to the first top electrode and a second wire spaced from the first wire and the first top electrode in the first direction and electrically coupled to the first bottom electrode.

11. The method of claim 8, further comprising:

etching the second electrode layer, the dielectric layer, and the first electrode layer, resulting in a first top electrode and a second top electrode respectively extending over a first bottom electrode and a second bottom electrode, wherein the first top electrode is spaced from the second top electrode by a first distance and the first bottom electrode is spaced from the second top electrode by a second distance that is less than the first distance.

12. The method of claim 8, further comprising removing the first masking layer after the first trench and the second trench are respectively etched to the first depth and to the second depth.

13. The method of claim 8, wherein material removed from the interlayer dielectric to form the first trench is etched at a first etch rate and material removed from the interlayer dielectric to form the second trench is etched at a second etch rate during the etching of the interlayer dielectric.

14. The method of claim 8, wherein after the etching of the interlayer dielectric, the interlayer dielectric has a second upper surface within the first trench at the first depth beneath the first upper surface and a third upper surface within the second trench at the second depth beneath the first upper surface.

15. The method of claim 8, wherein the first and second curved segments contact edge to edge between the first trench and the second trench.

16. The method of claim 8, wherein after the etching of the interlayer dielectric, the first masking layer has a first thickness between the first trench and the second trench, and a second thickness spaced from the first trench and the second trench that is greater than the first thickness, and wherein the first masking layer comprises a hard mask layer.

17. A method of forming capacitors in an integrated device, comprising:

forming an interlayer dielectric over a substrate;

forming a hard mask layer over the interlayer dielectric;

etching the interlayer dielectric, concurrently removing dielectric material from a first region at a first etch rate and removing dielectric material from a second region at a second etch rate that is less than the first etch rate, wherein the etching of the interlayer dielectric comprises etching through the hard mask layer;

depositing a first electrode layer over the interlayer dielectric, the first electrode layer having first outer sidewalls within the first region that are separated by a first width and second outer sidewalls within the second region separated by a second width; and subsequently depositing a dielectric layer and a second electrode layer over the first electrode layer, wherein the dielectric layer and the second electrode layer extend into the first region and the second region;

wherein after the etching of the interlayer dielectric and the hard mask layer, the hard mask layer has a first thickness between the first region and the second region, and a second thickness spaced from the first region and the second region that is greater than the first thickness.

18. The method of claim 17, further comprising:

patterning the hard mask layer before etching the interlayer dielectric, removing material from the hard mask layer to form a first opening with the first width and a second opening with the second width, wherein the interlayer dielectric is subsequently etched in the first region underlying the first opening and the second region underlying the second opening.

19. The method of claim 17, wherein the etching of the interlayer dielectric results in both a first opening in the first region having the first width and a first depth and a second opening in the second region having the second width and a second depth, wherein the second depth is less than the first depth.

20. The method of claim 17, wherein the second electrode layer is deposited after the dielectric layer, wherein a portion of the second electrode layer within the first region has third outer sidewalls separated by a third width, and wherein a portion of the second electrode layer within the second region has fourth outer sidewalls separated by a fourth width that is less than the first width.

* * * * *